(12) United States Patent
Masleid et al.

(10) Patent No.: US 7,598,731 B1
(45) Date of Patent: Oct. 6, 2009

(54) SYSTEMS AND METHODS FOR ADJUSTING THRESHOLD VOLTAGE

(76) Inventors: Robert Paul Masleid, 17266 Eaton La., Monte Sereno, CA (US) 95930; James B. Burr, 511 Broughton La., Foster City, CA (US) 94404

( * ) Notice: Subject to any disclaimer, the term of this patent is extended or adjusted under 35 U.S.C. 154(b) by 0 days.

(21) Appl. No.: 11/787,908

(22) Filed: Apr. 17, 2007

Related U.S. Application Data

(62) Division of application No. 10/771,015, filed on Feb. 2, 2004, now Pat. No. 7,205,758.

(51) Int. Cl.
*G01R 31/26* (2006.01)

(52) U.S. Cl. .............. 324/158.1; 324/763; 324/765

(58) Field of Classification Search .............. None
See application file for complete search history.

(56) References Cited

U.S. PATENT DOCUMENTS

| | | |
|---|---|---|
| 5,086,501 A | 2/1992 | DeLuca et al. |
| 5,167,024 A | 11/1992 | Smith et al. |
| 5,201,059 A | 4/1993 | Nguyen |
| 5,204,863 A | 4/1993 | Saint-Joigny et al. |
| 5,218,704 A | 6/1993 | Watts, Jr. et al. |
| 5,230,055 A | 7/1993 | Katz et al. |
| 5,239,652 A | 8/1993 | Seibert et al. |
| 5,422,591 A | 6/1995 | Rastegar et al. |
| 5,422,806 A | 6/1995 | Chen et al. |
| 5,440,520 A | 8/1995 | Schutz et al. |
| 5,461,266 A | 10/1995 | Koreeda et al. |
| 5,502,838 A | 3/1996 | Kikinis |
| 5,511,203 A | 4/1996 | Wisor et al. |
| 5,519,309 A | 5/1996 | Smith |
| 5,560,020 A | 9/1996 | Nakatani et al. |
| 5,592,173 A | 1/1997 | Lau et al. |
| 5,610,533 A | 3/1997 | Arimoto et al. |
| 5,682,093 A | 10/1997 | Kivela |
| 5,692,204 A | 11/1997 | Rawson et al. |
| 5,717,319 A | 2/1998 | Jokinen |
| 5,719,800 A | 2/1998 | Mittal et al. |
| 5,727,208 A | 3/1998 | Brown |
| 5,745,375 A | 4/1998 | Reinhardt et al. |

(Continued)

FOREIGN PATENT DOCUMENTS

EP     0381021     1/1990

(Continued)

OTHER PUBLICATIONS

"Wager Burn-In Isolation Circuit"; IBM Technical Disclosure Bulletin; IBM Corp. New York, US, vol. 32, No. 6B, Nov. 1, 1989, pp. 442-443; XP00073858 ISSN: 0018-8689 (The Whole Document).

(Continued)

*Primary Examiner*—Minh N Tang

(57) ABSTRACT

Systems and methods for adjusting threshold voltage. A threshold voltage of a transistor of an integrated circuit is measured. A bias voltage, which when applied to a body well of the transistor corrects a difference between the threshold voltage and a desired threshold voltage for the transistor, is determined. The bias voltage is encoded into non-volatile storage on the integrated circuit. The non-volatile storage can be digital and/or analog.

12 Claims, 3 Drawing Sheets

U.S. PATENT DOCUMENTS

| | | |
|---|---|---|
| 5,752,011 A | 5/1998 | Thomas et al. |
| 5,754,869 A | 5/1998 | Holzhammer et al. |
| 5,757,171 A | 5/1998 | Babcock |
| 5,778,237 A | 7/1998 | Yamamoto et al. |
| 5,812,860 A | 9/1998 | Horden et al. |
| 5,815,724 A | 9/1998 | Mates |
| 5,825,674 A | 10/1998 | Jackson |
| 5,848,281 A | 12/1998 | Smalley et al. |
| 5,880,620 A | 3/1999 | Gitlin et al. |
| 5,884,049 A | 3/1999 | Atkinson |
| 5,894,577 A | 4/1999 | MacDonald et al. |
| 5,923,545 A | 7/1999 | Nguyen |
| 5,933,649 A | 8/1999 | Lim et al. |
| 5,940,785 A | 8/1999 | Georgiou et al. |
| 5,940,786 A | 8/1999 | Steeby |
| 5,973,526 A | 10/1999 | Dabral |
| 5,974,557 A | 10/1999 | Thomas et al. |
| 5,996,083 A | 11/1999 | Gupta et al. |
| 5,996,084 A | 11/1999 | Watts |
| 6,035,407 A | 3/2000 | Gebara et al. |
| 6,047,248 A | 4/2000 | Georgiou et al. |
| 6,048,746 A | 4/2000 | Burr |
| 6,055,655 A | 4/2000 | Momohara |
| 6,078,319 A | 6/2000 | Bril et al. |
| 6,087,892 A | 7/2000 | Burr |
| 6,091,283 A | 7/2000 | Murgula et al. |
| 6,097,242 A | 8/2000 | Forbes et al. |
| 6,118,306 A | 9/2000 | Orton et al. |
| 6,119,241 A | 9/2000 | Michail et al. |
| 6,157,092 A | 12/2000 | Hofmann |
| 6,202,104 B1 | 3/2001 | Ober |
| 6,216,235 B1 | 4/2001 | Thomas et al. |
| 6,218,708 B1 | 4/2001 | Burr |
| 6,218,892 B1 | 4/2001 | Soumyanath et al. |
| 6,218,895 B1 | 4/2001 | De et al. |
| 6,232,793 B1 | 5/2001 | Arimoto et al. |
| 6,232,827 B1 | 5/2001 | De et al. |
| 6,272,642 B2 | 8/2001 | Pole, II et al. |
| 6,279,048 B1 | 8/2001 | Fadavi-Ardekani et al. |
| 6,303,444 B1 | 10/2001 | Burr |
| 6,304,824 B1 | 10/2001 | Bausch et al. |
| 6,311,287 B1 | 10/2001 | Dischler et al. |
| 6,314,522 B1 | 11/2001 | Chu et al. |
| 6,341,087 B1 | 1/2002 | Kunikiyo |
| 6,345,363 B1 | 2/2002 | Levy-Kendler |
| 6,347,379 B1 | 2/2002 | Dai et al. |
| 6,378,081 B1 | 4/2002 | Hammond |
| 6,388,432 B2 | 5/2002 | Uchida |
| 6,392,467 B1 | 5/2002 | Oowaki et al. |
| 6,411,156 B1 | 6/2002 | Borkar et al. |
| 6,415,388 B1 | 7/2002 | Browning et al. |
| 6,425,086 B1 | 7/2002 | Clark et al. |
| 6,427,211 B2 | 7/2002 | Watts, Jr. |
| 6,442,746 B1 | 8/2002 | James et al. |
| 6,456,157 B1 | 9/2002 | Forbes et al. |
| 6,457,135 B1 | 9/2002 | Cooper |
| 6,466,077 B1 | 10/2002 | Miyazaki et al. |
| 6,477,654 B1 | 11/2002 | Dean et al. |
| 6,484,265 B2 | 11/2002 | Borkar et al. |
| 6,487,668 B2 | 11/2002 | Thomas et al. |
| 6,489,224 B1 | 12/2002 | Burr |
| 6,510,400 B1 | 1/2003 | Moriyama |
| 6,510,525 B1 | 1/2003 | Nookala et al. |
| 6,513,124 B1 | 1/2003 | Furuichi et al. |
| 6,518,826 B2 | 2/2003 | Zhang |
| 6,519,706 B1 | 2/2003 | Ogoro |
| 6,574,739 B1 | 6/2003 | Kung et al. |
| 6,600,346 B1 | 7/2003 | Macaluso |
| 6,614,301 B2 | 9/2003 | Casper et al. |
| 6,621,325 B2 | 9/2003 | Hart et al. |
| 6,653,890 B2 | 11/2003 | Ono et al. |
| 6,731,157 B2 | 5/2004 | Fulkerson |
| 6,777,978 B2 | 8/2004 | Hart et al. |
| 6,784,722 B2 | 8/2004 | Tang et al. |
| 6,792,379 B2 | 9/2004 | Ando |
| 6,794,630 B2 | 9/2004 | Keshavarzi et al. |
| 6,812,758 B2 | 11/2004 | Gauthier et al. |
| 6,847,252 B1 | 1/2005 | Ono et al. |
| 6,858,897 B2 | 2/2005 | Chen |
| 6,864,539 B2 | 3/2005 | Ishibashi, et al. |
| 6,912,155 B2 | 6/2005 | Sakurai et al. |
| 6,967,522 B2 | 11/2005 | Chandrakasan et al. |
| 6,992,508 B2 | 1/2006 | Chow |
| 7,129,745 B2 | 10/2006 | Lewis, et al. |
| 7,334,198 B2 | 2/2008 | Ditzel, et al. |
| 7,348,827 B2 | 3/2008 | Rahim, et al. |
| 2002/0002689 A1 | 1/2002 | Yeh |
| 2002/0026597 A1 | 2/2002 | Dai et al. |
| 2002/0029352 A1 | 3/2002 | Borkar et al. |
| 2002/0030533 A1 | 3/2002 | De et al. |
| 2002/0033510 A1 | 3/2002 | Tomita |
| 2002/0073348 A1 | 6/2002 | Tani |
| 2002/0083356 A1 | 6/2002 | Dai |
| 2002/0087896 A1 | 7/2002 | Cline et al. |
| 2002/0113628 A1 | 8/2002 | Ajit |
| 2002/0116650 A1 | 8/2002 | Halepete et al. |
| 2002/0138778 A1 | 9/2002 | Cole et al. |
| 2002/0140494 A1 | 10/2002 | Thomas et al. |
| 2002/0178390 A1 | 11/2002 | Lee |
| 2002/0194509 A1 | 12/2002 | Plante et al. |
| 2003/0005278 A1 | 1/2003 | Tschanz et al. |
| 2003/0021161 A1* | 1/2003 | Fifield et al. ............ 365/189.09 |
| 2003/0037068 A1 | 2/2003 | Thomas et al. |
| 2003/0038876 A1 | 2/2003 | Nagashima |
| 2003/0063513 A1 | 4/2003 | Tsunoda et al. |
| 2003/0065960 A1 | 4/2003 | Rusu et al. |
| 2003/0074591 A1 | 4/2003 | McClendon et al. |
| 2003/0080802 A1 | 5/2003 | Ono et al. |
| 2003/0132735 A1 | 7/2003 | Fulkerson |
| 2003/0149988 A1 | 8/2003 | Ellis et al. |
| 2004/0014268 A1* | 1/2004 | Ishibashi et al. ............ 438/200 |
| 2004/0016977 A1 | 1/2004 | Miyazaki et al. |
| 2004/0021501 A1 | 2/2004 | Das et al. |
| 2004/0025061 A1 | 2/2004 | Lawrence |
| 2004/0073821 A1 | 4/2004 | Naveh et al. |
| 2004/0109354 A1 | 6/2004 | Wang et al. |
| 2004/0123170 A1 | 6/2004 | Tschanz et al. |
| 2004/0125644 A1 | 7/2004 | Komatsuzaki |
| 2004/0128631 A1 | 7/2004 | Ditzel et al. |
| 2004/0155696 A1 | 8/2004 | Gauthier et al. |
| 2004/0217372 A1 | 11/2004 | Chen |
| 2005/0160465 A1 | 7/2005 | Walker |
| 2005/0225376 A1 | 10/2005 | Kin Law |
| 2005/0237083 A1 | 10/2005 | Bakker et al. |
| 2005/0280437 A1 | 12/2005 | Lewis et al. |
| 2006/0157818 A1 | 7/2006 | Williams et al. |
| 2006/0223257 A1 | 10/2006 | Williams et al. |

FOREIGN PATENT DOCUMENTS

| | | |
|---|---|---|
| EP | 0474963 | 4/1991 |
| EP | 0501655 | 2/1992 |
| JP | 409185589 | 7/1997 |
| WO | 0127728 | 4/2001 |

OTHER PUBLICATIONS

Baker, K., et al.; "SHMOO Plotting: The Black Art of IC Testing"; IEEE Design & Test of Computers, IEEE vol. 14, No. 3; July 1, 1997, pp. 90-97, XP000793305 ISSN: 0740-7475 the whole documents.

Computer Software, Wikipedia; "http://en.wikipedia.org/wiki/Software"; retrieved on May 2, 2007.

Desai, et al.; "Sizing of Clock Distribution Networks for High Performance CPU Chips"; Digital Equipment Corporation, Hudson, MA, pp. 389-394, 1996.

* cited by examiner

SYSTEMS AND METHODS FOR ADJUSTING THRESHOLD VOLTAGE

RELATED APPLICATION

This application is a Divisional Application of U.S. patent application Ser. No. 10/771,015, now U.S. Pat. No. 7,205,758, filed Feb. 2, 2004, which is hereby incorporated herein by reference in its entirety.

FIELD OF THE INVENTION

Embodiments in accordance with the present invention relate to systems and methods for adjusting threshold voltage.

BACKGROUND

It is desirable to adjust threshold voltages of transistors in highly integrated semiconductors, e.g., microprocessors, for a variety of reasons including, for example, to reduce power consumption and heat generation of such integrated circuits and/or to eliminate process variation effects on threshold voltage.

SUMMARY OF THE INVENTION

Therefore, systems and methods of adjusting threshold voltage would be highly desirable.

Accordingly, systems and methods for adjusting threshold voltage are disclosed. In accordance with a first embodiment of the present invention, a threshold voltage of a transistor of an integrated circuit is measured. A bias voltage, which when applied to a body well of the transistor corrects a difference between the threshold voltage and a desired threshold voltage for the transistor, is determined. The measure of the bias voltage may be encoded into non-volatile storage on the integrated circuit. The non-volatile storage can be digital and/or analog. In one embodiment, the non-volatile storage is computer usable.

In accordance with another embodiment of the present invention, a bias voltage representation is accessed from non-volatile storage of an integrated circuit. A bias voltage corresponding to the bias voltage representation is generated. The bias voltage is coupled to body biasing wells of the integrated circuit.

DETAILED DESCRIPTION OF THE INVENTION

Figure 1:
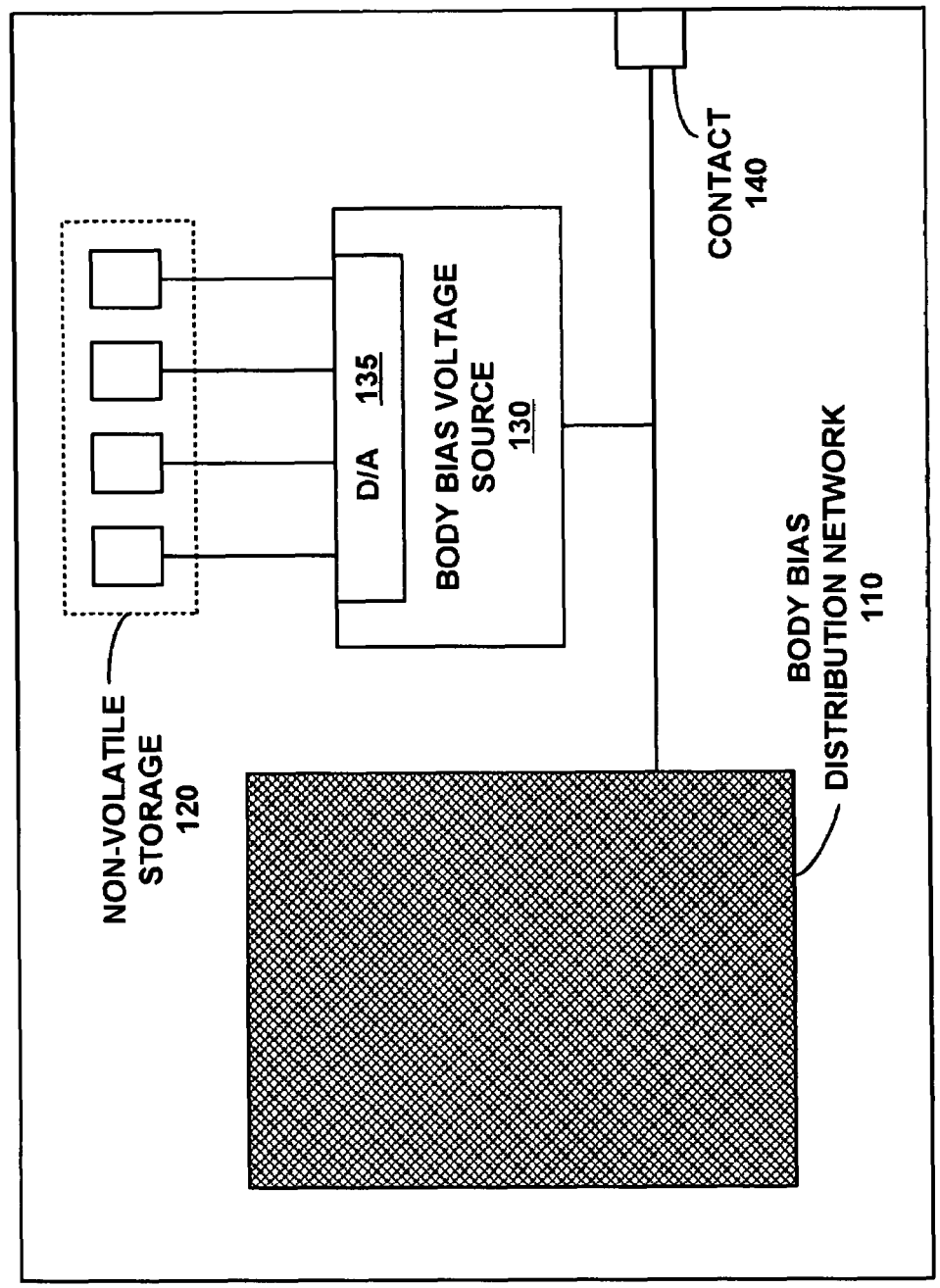
FIG. 1 illustrates an integrated circuit in accordance with embodiments of the present invention.

In the following detailed description of the present invention, systems and methods for encoding threshold voltage adjustments, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow (e.g., methods 200 and 300) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing" or "measuring" or "adjusting" or "generating" or "performing" or "comparing" or "synchronizing" or "accessing" or "retrieving" or "conveying" or "sending" or "resuming" or "installing" or "gathering" or the like, refer to the action and processes of a computer system, or similar electronic computing device" that manipulates and transforms data represented as physical (electronic) quantities within the computer system's registers and memories into other data similarly represented as physical quantities within the computer system memories or registers or other such information storage, transmission or display devices.

Systems and Methods for Adjusting Threshold Voltage

Embodiments in accordance with the present invention are described in the context of design and operation of integrated semiconductors. More particularly, embodiments of the present invention relate to systems and methods for adjusting threshold voltage. It is appreciated, however, that elements of the present invention may be utilized in other areas of semiconductor operation.

The following description of embodiments in accordance with the present invention is directed toward coupling a body-bias voltage to pFETs (or p-type MOSFETS) formed in surface N-wells when a p-type substrate and an N-well process are utilized. For example, the coupling can comprise a conductive sub-surface region of N-type doping. In one embodiment, coupling a body-bias voltage to nFETs (or n-type MOSFETs) can be accomplished through the p-substrate.

It is to be appreciated, however, that embodiments in accordance with the present invention are equally applicable to coupling a body-bias voltage to nFETs (or n-type MOSFETS) formed in surface P-wells when an n-type substrate and a P-well process are utilized, e.g., comprising a conductive sub-surface region of P-type doping. Consequently, embodiments in accordance with the present invention are well suited to semiconductors formed in n-type materials, and such embodiments are considered within the scope of the present invention.

FIG. 1 illustrates an integrated circuit 100 in accordance with embodiments of the present invention. Integrated circuit 100 comprises a body bias voltage distribution network 110 for coupling a body bias voltage to a plurality of body biasing wells of the integrated circuit. The plurality of body biasing wells enable threshold voltage adjustments of transistors fabricated within such wells. Body bias voltage distribution network 110 can comprise deep well structures, e.g., a deep n-well.

Integrated circuit 100 further comprises non-volatile storage 120 for storing a representation of a body bias voltage. Non-volatile storage 120 can comprise a variety of well known non-volatile memory types, for example, flash memory, electrically erasable programmable read only memory, one-time programmable fuses, magnetic structures, e.g., magneto-resistive random access memory, and the like. Such non-volatile memory types are well suited to storing a digital representation of a body bias voltage, e.g., a plurality of bit values. It is appreciated that such digital representations of a body bias voltage are well suited to access by a computer.

In accordance with embodiments of the present invention, non-volatile storage 120 can also store an analog representation of a body bias voltage. For example, a quantity of charge corresponding to the body bias voltage can be stored in a floating gate. In accordance with other embodiments of the present invention, such an analog representation of a body bias voltage can be used to directly control generation of a body bias voltage. For example, a charge stored on a floating gate can influence a current utilized by a voltage source to generate the bias voltage.

Integrated circuit 100 optionally comprises a body bias voltage source 130 for generating the body bias voltage. Integrated circuit 100 can also optionally comprise an electrical contact 140 for coupling the body bias voltage from an external source.

In accordance with embodiments of the present invention, the representation of a body bias voltage stored in non-volatile storage 120 can directly control a body bias voltage source. For example, a body bias voltage source, e.g., body bias voltage source 130, can comprise a digital to analog converter 135. An input value for the digital to analog converter can be drawn directly from cells of non-volatile storage 120, for example without an explicit read operation. In addition, as previously described, an analog representation of a body bias voltage can be used directly in the generation of a body bias voltage.

In accordance with other embodiments of the present invention, the representation of a body bias voltage stored in non-volatile storage 120 can be retrieved under software control, e.g., by a microprocessor, and provided to a body bias voltage source, e.g., body bias voltage source 130 or a body bias voltage source external to the integrated circuit, as a programmable value. Retrieval by software enables a wide variety of computer-implemented adjustments to the representation of a body bias voltage, for example, combining the stored value with other compensation factors, e.g., to adjust for temperature and/or operating frequency conditions.

Figure 2:
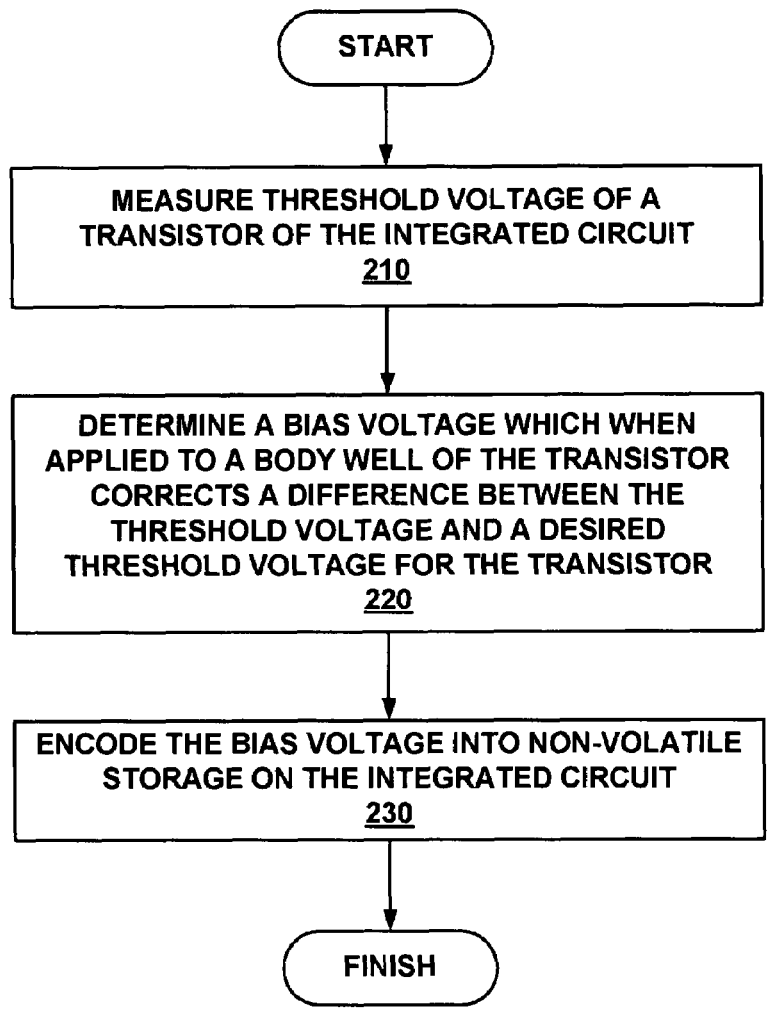
FIG. 2 illustrates a flow chart of a method of encoding threshold voltage adjustments for an integrated circuit, in accordance with embodiments of the present invention.

FIG. 2 illustrates a flow chart of a computer controlled method 200 of encoding threshold voltage adjustments for an integrated circuit, in accordance with embodiments of the present invention. In block 210, a threshold voltage of a transistor of the integrated circuit is measured. Such measurements can be performed by a variety of well known procedures, e.g., by conventional integrated circuit testers, either at a wafer level or for individual integrated circuits. It is to be appreciated that even though threshold voltages can be subject to large variations across an integrated circuit, a target encoding can compensate for disparities between a threshold voltage of the devices being measured and individual or aggregate behavior of devices being controlled.

In block 220, a bias voltage, which when applied to a body well of the transistor corrects a difference between the threshold voltage and a desired threshold voltage for the transistor, is determined. The determining may be performed in a closed loop measurement operation, in one example. For example, a bias voltage is applied to the transistor's body well and the threshold voltage of the transistor is measured. The bias voltage can be adjusted, e.g., increased or decreased, until the desired threshold voltage is achieved. In accordance with other embodiments of the present invention, the bias voltage necessary for threshold voltage correction may also be determined in an open loop manner, e.g., via automated calculation and/or by reference to a lookup table based upon a measurement of threshold voltage.

In accordance with embodiments of the present invention, a desired threshold voltage can be selected from among a wide variety of threshold voltages. For example, a desired threshold voltage can be a semiconductor process nominal threshold voltage. In such a case, other embodiments in accordance with the present invention can enable operation of a semiconductor at a process nominal threshold voltage, eliminating threshold voltage process variations. Alternatively, a desired threshold voltage could be selected to enable low power operation, e.g., at a particular operating frequency.

In block 230, the bias voltage is written or otherwise encoded into non-volatile storage on the integrated circuit. The non-volatile storage can comprise a variety of types of analog and/or digital non-volatile storage, including, for example, flash memory, electrically erasable programmable read only memory, one time programmable fuses, floating gates, capacitors, magnetic structures and the like.

Figure 3:
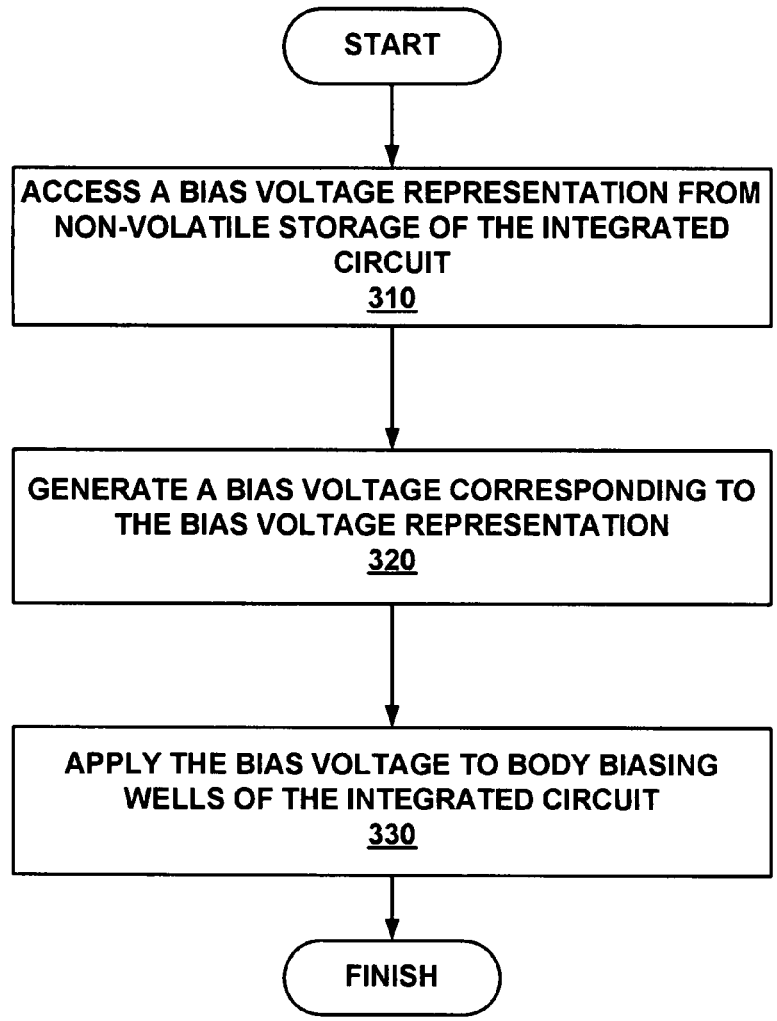
FIG. 3 illustrates a flow chart for a method of biasing an integrated circuit, in accordance with embodiments of the present invention.

FIG. 3 illustrates a flow chart for a method 300 of biasing an integrated circuit, in accordance with embodiments of the present invention. In block 310, a bias voltage representation is accessed from non-volatile storage of the integrated circuit. The accessing can be performed substantially by hardware. For example, bit values stored in non-volatile memory cells can directly drive a digital to analog converter utilized in a bias voltage supply. Embodiments in accordance with the present invention are well suited to accessing such non-volatile memory cells with a hardware controlled "read" operation, as well as being well suited to a memory cell value directly driving a signal line. Alternatively, an analog quantity corresponding to a bias voltage can be utilized directly in bias voltage supply circuitry. Alternatively, a bias voltage representation can be accessed under software control, e.g., by a microprocessor, and subsequently loaded into a bias voltage supply.

In block 320, a bias voltage corresponding to the bias voltage representation is generated, for example by body bias voltage source 130 of FIG. 1. In accordance with embodiments of the present invention, such bias voltage generation can be performed either on the integrated circuit or external to the integrated circuit.

Still referring to FIG. 3, in block 330, the bias voltage is applied to body biasing wells of the integrated circuit. If the bias voltage was generated external to the integrated circuit, the bias voltage can be further coupled to the integrated circuit, for example via contact 140 of FIG. 1.

Embodiments in accordance with the present invention provide for adjusting threshold voltages of transistors in highly integrated semiconductors, e.g., microprocessors, for example to reduce power consumption and heat generation of such integrated circuits and/or to eliminate process variation effects on threshold voltage.

Embodiments in accordance with the present invention, systems and methods for measuring, reading, accessing and adjusting threshold voltage, are thus described. While the present invention has been described in particular embodiments, it should be appreciated that the present invention should not be construed as limited by such embodiments, but rather construed according to the below claims.

What is claimed is:

1. A method of encoding threshold voltage adjustments for an integrated circuit, said method comprising:
    measuring a threshold voltage of a transistor of said integrated circuit;
    determining a bias voltage which when applied to a body well of said transistor corrects a difference between said threshold voltage and a desired threshold voltage for said transistor; and
    encoding said bias voltage into non-volatile storage on said integrated circuit.

2. The method of claim 1 wherein said transistor is a p channel field effect transistor.

3. The method of claim 1 wherein said transistor is an n channel field effect transistor.

4. The method of claim 1 wherein said non-volatile storage comprises a fuse.

5. The method of claim 1 wherein said non-volatile storage comprises electrically erasable programmable read only memory.

6. The method of claim 1 wherein said encoding stores a digital representation of said bias voltage.

7. The method of claim 6 wherein said digital representation of said bias voltage is accessible by a bias voltage source.

8. The method of claim 6 wherein said digital representation of said bias voltage is accessible by a microprocessor.

9. The method of claim 1 wherein said encoding stores an analog representation of said bias voltage.

10. The method of claim 9 wherein said analog representation of said bias voltage is accessible by a bias voltage source.

11. The method of claim 1 wherein said desired threshold voltage is a nominal process threshold voltage for said integrated circuit.

12. The method of claim 1 wherein said desired threshold voltage is determined based on power consumption characteristics of said integrated circuit at a specific operating frequency.

* * * * *